(12) United States Patent  (10) Patent No.: US 7,939,932 B2
Martin  (45) Date of Patent: May 10, 2011

(54) PACKAGED CHIP DEVICES WITH ATOMIC LAYER DEPOSITION PROTECTIVE FILMS

(75) Inventor: John R. Martin, Foxborough, MA (US)

(73) Assignee: Analog Devices, Inc., Norwood, MA (US)

( * ) Notice: Subject to any disclaimer, the term of this patent is extended or adjusted under 35 U.S.C. 154(b) by 223 days.

(21) Appl. No.: 12/143,391

(22) Filed: Jun. 20, 2008

(65) Prior Publication Data

US 2008/0315334 A1  Dec. 25, 2008

Related U.S. Application Data

(60) Provisional application No. 60/945,209, filed on Jun. 20, 2007.

(51) Int. Cl.
*H01L 23/48* (2006.01)
*H01L 23/52* (2006.01)

(52) U.S. Cl. ........ 257/690; 257/678; 257/710; 257/704; 257/729

(58) Field of Classification Search .......... 257/679, 257/689, 704, 707, 710, 730, 729, 684, 685, 257/686, 687, 734, 678
See application file for complete search history.

(56) References Cited

U.S. PATENT DOCUMENTS

| | | | |
|---|---|---|---|
| 4,058,430 A | 11/1977 | Suntola et al. | 156/611 |
| 4,389,973 A | 6/1983 | Suntola et al. | 118/725 |
| 4,413,022 A | 11/1983 | Suntola et al. | 427/255 |
| 5,362,681 A | 11/1994 | Roberts, Jr. et al. | 437/226 |
| 5,461,545 A * | 10/1995 | Leroy et al. | 361/765 |
| 5,916,365 A | 6/1999 | Sherman | 117/92 |
| 6,015,590 A | 1/2000 | Suntola et al. | 427/255.23 |
| 6,124,158 A | 9/2000 | Dautartas et al. | 438/216 |
| 6,323,550 B1 | 11/2001 | Martin et al. | 257/704 |
| 6,342,277 B1 | 1/2002 | Sherman | 427/562 |
| 6,416,822 B1 | 7/2002 | Chiang et al. | 427/561 |
| 6,461,436 B1 | 10/2002 | Campbell et al. | 118/715 |
| 6,465,280 B1 | 10/2002 | Martin et al. | 438/125 |
| 6,468,924 B2 | 10/2002 | Lee et al. | 438/763 |
| 6,569,501 B2 | 5/2003 | Chiang et al. | 427/535 |
| 6,579,374 B2 | 6/2003 | Bondestam et al. | 118/725 |
| 6,613,696 B2 | 9/2003 | Wen et al. | 438/769 |
| 6,616,986 B2 | 9/2003 | Sherman | 427/562 |

(Continued)

OTHER PUBLICATIONS

Groner, M.D. et al., "Gas Diffusion Barriers on Polymers Using $Al_2O_3$ Atomic Layer Deposition," Applied Physics Letters, 88, 051907, 3 pages, Jan. 31, 2006.

(Continued)

*Primary Examiner* — Thao X Le
*Assistant Examiner* — Thanh Y Tran
(74) *Attorney, Agent, or Firm* — Sunstein Kann Murphy & Timbers LLP

(57) ABSTRACT

A low-temperature inorganic dielectric ALD film (e.g., $Al_2O_3$ and $TiO_2$) is deposited on a packaged or unpackaged chip device so as to coat the device including any exposed electrical contacts. Such a low-temperature ALD film generally can be deposited without damaging the packaged chip device. The ALD film is typically deposited at a sufficient thickness to provide desired qualities (e.g., hermeticity for the entire packaged chip device, passivation for the electrical contacts, biocompatibility, etc.) but still allow for electrical connections to be made to the electrical contacts (e.g., by soldering or otherwise) directly through the ALD film without having to expose the electrical contacts.

18 Claims, 3 Drawing Sheets

U.S. PATENT DOCUMENTS

| | | | |
|---|---|---|---|
| 6,621,158 B2 | 9/2003 | Martin et al. | 257/704 |
| 6,652,924 B2 | 11/2003 | Sherman | 427/576 |
| 6,699,783 B2 | 3/2004 | Raaijmakers et al. | 438/633 |
| 6,716,284 B2 | 4/2004 | Campbell et al. | 117/105 |
| 6,723,642 B1 | 4/2004 | Lim et al. | 438/680 |
| 6,730,614 B1 | 5/2004 | Lim et al. | 438/763 |
| 6,734,550 B2 | 5/2004 | Martin et al. | 257/704 |
| 6,758,911 B2 | 7/2004 | Campbell et al. | 118/715 |
| 6,784,096 B2 | 8/2004 | Chen et al. | 438/637 |
| 6,828,218 B2 | 12/2004 | Kim et al. | 438/478 |
| 6,846,743 B2 | 1/2005 | Endo et al. | 438/681 |
| 6,911,727 B1 | 6/2005 | Martin et al. | 257/704 |
| 6,933,225 B2 | 8/2005 | Werkhoven et al. | 438/637 |
| 6,963,125 B2 * | 11/2005 | Featherby et al. | 257/680 |
| 7,037,574 B2 | 5/2006 | Paranjpe et al. | 428/200 |
| 7,057,251 B2 | 6/2006 | Reid | 257/432 |
| 7,078,800 B2 * | 7/2006 | Kwon et al. | 257/704 |
| 7,084,024 B2 | 8/2006 | Gluschenkov et al. | 438/199 |
| 7,250,083 B2 | 7/2007 | Sneh | 117/84 |
| 7,338,901 B2 | 3/2008 | Ishizaka | 438/680 |
| 7,348,193 B2 | 3/2008 | Ouyang | 438/25 |
| 7,426,067 B1 | 9/2008 | Bright et al. | 359/223 |
| 2004/0076751 A1 | 4/2004 | Sherman | 427/255.34 |
| 2004/0083949 A1 | 5/2004 | Sherman | 117/84 |
| 2004/0221798 A1 | 11/2004 | Sherman | 117/86 |
| 2005/0012975 A1 | 1/2005 | George et al. | 359/223 |
| 2005/0046016 A1 * | 3/2005 | Gilleo | 257/713 |
| 2006/0231017 A1 | 10/2006 | Vaartstra | 117/105 |
| 2006/0257584 A1 | 11/2006 | Derderian et al. | 427/569 |
| 2007/0004080 A1 | 1/2007 | Ouyang | 438/106 |
| 2007/0013052 A1 * | 1/2007 | Zhe et al. | 257/704 |
| 2007/0036894 A1 | 2/2007 | Thompson et al. | 427/248.1 |
| 2007/0037391 A1 | 2/2007 | Thompson | 438/680 |
| 2007/0037412 A1 | 2/2007 | Dip et al. | 438/785 |
| 2007/0049045 A1 | 3/2007 | Zimmerman et al. | 438/758 |
| 2007/0071894 A1 | 3/2007 | Mieno | 427/248.1 |
| 2007/0298532 A1 | 12/2007 | Machauf | 438/48 |
| 2008/0308912 A1 * | 12/2008 | Cha et al. | 257/659 |

OTHER PUBLICATIONS

C.F. Herrmann et al., "Hydrophobic Coatings Using Atomic Layer Deposition and Non-Chlorinated Precursors," Technical Digest of the 17$^{th}$ IEEE International Conference on Micro-Electro-Mechanical Systems, pp. 653-656, Jan. 2004.

C.F. Herrmann et al., "Conformal Hydrophobic Coatings Prepared Using Atomic Layer Deposition Seed Layers and Non-Chlorinated Hydrophobic Precursors," J. Micromech. and Microeng. 15, pp. 984-992, Mar. 30, 2005.

N. Hoivik et al., "Atomic Layer Deposition of Conformal Dielectric and Protective Coatings for Released Micro-Electromechanical Devices," IEEE, pp. 455-458, 2002.

Groner, M.D., et al., "Low-Temperature $Al_2O_3$ Atomic Layer Deposition," Chem. Mater., 16, pp. 639-645, Jan. 30, 2004.

N. Hoivik et al., "Atomic Layer Deposited Protective Coatings for Micro-Electromechanical Systems," Sensors and Actuators, 103, pp. 100-108, 2003.

Groner, M.D., et al., "Electrical Characterization of Thin $Al_2O_3$ Films Grown by Atomic Layer Deposition on Silicon and Various Metal Substrates," Thin Solid Films, 413, pp. 186-197, Jun. 24, 2002.

Wilson, C.A., et al., "Nucleation and Growth During $Al_2O_3$ Atomic Layer Deposition on Polymers," Chem. Mater., 17, pp. 5625-5634, published in the Web Oct. 13, 2005.

J. Elam, "Introduction to Atomic Layer Deposition," Dept. of Chemistry, Univ. of Colorado, Power Point Presentation, pp. 1-6, undated.

S.M. George et al., "Atomic Layer Deposition of Thin Films Using Sequential Surface Reactions," Mat. Res. Soc. Symp. Proc., vol. 616, pp. 93-101, Apr. 24-26, 2000.

Braun, A., "ALD Breaks Materials, Conformality Barriers," Semiconductor International, pp. 1-5, Oct. 2001.

O. Hahtela et al., "Atomic Layer Deposited Alumina ($Al_2O_3$) Thin Films On A High-Q Mechanical Silicon Oscillator," J. Micromech. And Microeng. 17, pp. 737-742, Mar. 8, 2007.

R.L Puurunen et al., "Implementing ALD layers in MEMS processing," publication of VTT Technical Research Centre of Finland, 1 page, undated.

Eyoum M. A. N., "Modularly Integrated MEMS Technology," a dissertation submitted in partial satisfaction of the requirements for the degree of Doctor of Philosophy, University of California, Berkeley, Spring 2006; 179 pages.

H. Kumagai et al., "Comparative Study of $Al_2O_3$ Optical Crystalline Thin Films Grown by Vapor Combinations of $Al(CH_3)_3/N_2O$ And $Al(CH_3)_3/H_2O_2$," Japanese Journal of Applied Physics, 32, pp. 6137-6140 (1993).

S. Petrovic et al., "Reliability Test Methods for Media-Compatible Pressure Sensors," IEEE Trans. Industrial Electron., Vo. 45, No. 6, 877-885, (1998).

Petrovic, S., "Progress in media compatible pressure sensors", Proc. of InterPACK'01, the Pacific Rim/International Intersociety Electronic Packaging Technical Conf. & Exhibition (ASME, New York 2001) IPACK2001-15517, Jul. 8-13, 2001.

Stoldt, C et al., Ultra-thin film encapsulation processes for microelectro-mechanical devices and systems, J. Phys. D. Appl. Phys, 39 R163-R170, published Apr. 20, 2006.

Hoivik, N. et al., "Atomic Layer Deposition (ALD) Technology for Reliable RF MEMS," IEEE MTT-S Digest (2002).

Ashurst, W.R. et al., "Nanometer-thin Titania Films With SAM-level Stiction And Superior Wear Resistance For Reliable MEMS Performance", pp. 153-156, IEEE (2004).

Sundew Technologies; 2 pp.; http://www.sundewtech.com.applications.html/.

* cited by examiner

PACKAGED CHIP DEVICES WITH ATOMIC LAYER DEPOSITION PROTECTIVE FILMS

CROSS-REFERENCE TO RELATED APPLICATION(S)

This patent application claims priority from U.S. Provisional Patent Application No. 60/945,209 entitled APPLICATIONS FOR ATOMIC LAYER DEPOSITION FILMS, which was filed on Jun. 20, 2007 in the name of John R. Martin and is hereby incorporated herein by reference in its entirety.

FIELD OF THE INVENTION

The present invention relates generally to applications for Atomic Layer Deposition Films, particularly in MEMS and semiconductor products and processes.

BACKGROUND

Atomic Layer Deposition (ALD) is a relatively old process that deposits near-perfect layer-by-layer films onto surfaces based on sequential self-limiting surface reactions. Early ALD processes were demonstrated in the 1970s through 1990s (e.g., U.S. Pat. No. 4,058,430; U.S. Pat. No. 4,389,973; Kumagai, H. et al., *Comparative study of $Al_2O_3$ optical crystalline thin films grown by vapor combinations of $Al(CH_3)_3/N_2O$ and $Al(CH_3)_3/H_2O_2$*, Jpn. Appl. Phys., 32, 6137 (1993); all of which are hereby incorporated by reference in their entireties.

The following is a general description of an ALD process:

| Step 1. | Gas Molecule A + Reactant gas |
| --- | --- |
| | ↓ |
| | Surface A (Single Layer) + By-product gas |
| Step 2. | Purge |
| Step 3. | Gas Molecule B + Reactant gas |
| | ↓ |
| | Surface B (Single Layer on A) + By-product gas |
| Step 4. | Purge |

The deposition process is normally preceded by a light $N_2$ plasma clean. Molecule A is typically a metallo-organic species. Species A and B react with one another. Steps 1-4 are typically repeated a number of times in order to produce an ALD film with composition ABABAB . . . . It should be noted that the A-B sequence may terminate with either A or B as the top layer; additional layers may be formed on the ALD film, some examples of which are described below. Thickness is controlled by the number of AB sequences. Most ALD films are dielectric, but conductive and bilayer films can also be produced.

In one specific example of an ALD process that produces an aluminum oxide ("alumina") film, Molecule A is $Al(CH_3)_3$ while Molecule B is $H_2O$. The reactions are as follows:

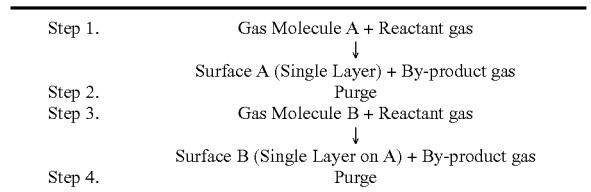

Overall Reaction

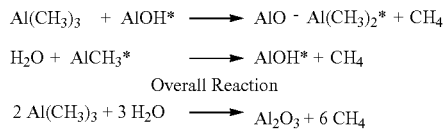

where the asterisk (*) indicates a surface species. In this example, each AB layer adds approximately 1.25 angstroms of thickness to the film.

Published data suggests that 25 angstroms of alumina ALD on polymer films (including polyimides) does not significantly reduce gas and water permeation, 50 angstroms provides approximately 10-times reduction in permeation rates, and 100 angstroms reduces moisture transmission by more than 100 times (see Groner, M. D. et al., *Gas diffusion barriers on polymers using $Al_2O_3$ atomic layer deposition*, Appl. Phys. Letters, 88(5) 051907 (2006), which is hereby incorporated herein by reference in its entirety).

In another specific example, an ALD film is formed of $Al_2O_3$—$TiO_2$ bilayers (i.e., alternating layers of $Al_2O_3$ and $TiO_2$). Experimental data suggests that such alumina-titania bilayer films are better barriers than films formed with just one of these materials. Such ALD films may be deposited at approximately 60° C., although higher temperature processes would generally produce denser films with better electrical properties.

Traditionally, ALD processes were run at high temperatures (e.g., near or above 500° C.). However, there have been a number of papers published showing that ALD films can be produced at lower temperatures (e.g., <200° C.). A University of Colorado group has published extensively using a 177° C. process and have shown process capabilities as low as 35° C. See, for example, Hoivik, Nils D. et al., *Atomic layer deposited protective coatings for micro-electromechanical systems*, Sensors and Actuators A 103 (2003) 100-108; Hermann, C. F. et al., *Hydrophobic Coatings Using Atomic Layer Deposition and Non-Chlorinated Precursors*; and Herman, Carl F. et al., *Conformal hydrophobic coatings prepared using atomic layer deposition seed layers and non-chlorinated hydrophobic precursors*, J. Micromech. Microeng. 15 (2005) 984-992; all of which are hereby incorporated herein by reference in their entireties. Generally speaking, ALD films deposited at low temperature are amorphous, tend to retain some carbon and hydrogen, and typically have lower dielectric strength than high temperature ALD films.

SUMMARY OF THE INVENTION

In accordance with one aspect of the invention there is provided apparatus including a packaged chip device including a chip device disposed in a package having at least one electrical contact allowing for electrical connection to the chip device and a low-temperature inorganic dielectric atomic layer deposition film disposed on an outer surface of the packaged chip device and covering the at least one electrical contact, the atomic layer deposition film being of a thickness sufficient to allow electrical connection to the at least one electrical contact through the atomic layer deposition film without having to expose the at least one electrical contact.

In various alternative embodiments, the chip device may include an integrated circuit device and/or a MEMS device (e.g., a MEMS accelerometer or a MEMS gyroscope). The packaged chip device may be non-hermetic (e.g., plastic), in which case the atomic layer deposition film may hermetically envelop the packaged chip device. The atomic layer deposition film may passivate the at least one electrical contact.

In other embodiments, a passivation material (e.g., a self assembling monolayer material such as, for example, octyltrichlorosilane or perfluorodecyltrichlorosilane) may be disposed over the atomic layer deposition film.

In still other embodiments, the packaged chip device may include an opening, in which case the atomic layer deposition film may cover structure exposed through the opening so as to protect the structure from exposure to the external environment. The structure exposed through the opening may include such things as a wire bond pad, an interconnect, a circuit, or a moving part. For example, the chip device may include a MEMS microphone device and the atomic layer deposition film may cover an exposed diaphragm of the MEMS microphone device. The chip device may include other types of MEMS devices (e.g., MEMS pressure sensor, MEMS flow sensor, MEMS microswitch) and the atomic layer deposition film may cover an exposed structure of such devices.

In yet other embodiments, the apparatus further includes a substrate such as a circuit board, wherein the packaged chip device is soldered to the circuit board directly through the atomic layer deposition film.

In yet other embodiments, the apparatus further includes a substrate such as a circuit board, wherein the chip device is a chip scale package that is soldered to the circuit board directly through the atomic layer deposition film.

In yet other embodiments, the apparatus further includes a substrate such as a circuit board, wherein the at least one chip device, packaged or unpackaged, is mounted on the substrate before deposition of the atomic layer deposition film.

BRIEF DESCRIPTION OF THE DRAWINGS

The foregoing and advantages of the invention will be appreciated more fully from the following further description thereof with reference to the accompanying drawings wherein.

It should be noted that the foregoing figures and the elements depicted therein are not necessarily drawn to consistent scale or to any scale. Unless the context otherwise suggests, like elements are indicated by like numerals.

DETAILED DESCRIPTION OF SPECIFIC EMBODIMENTS

Figure 1:
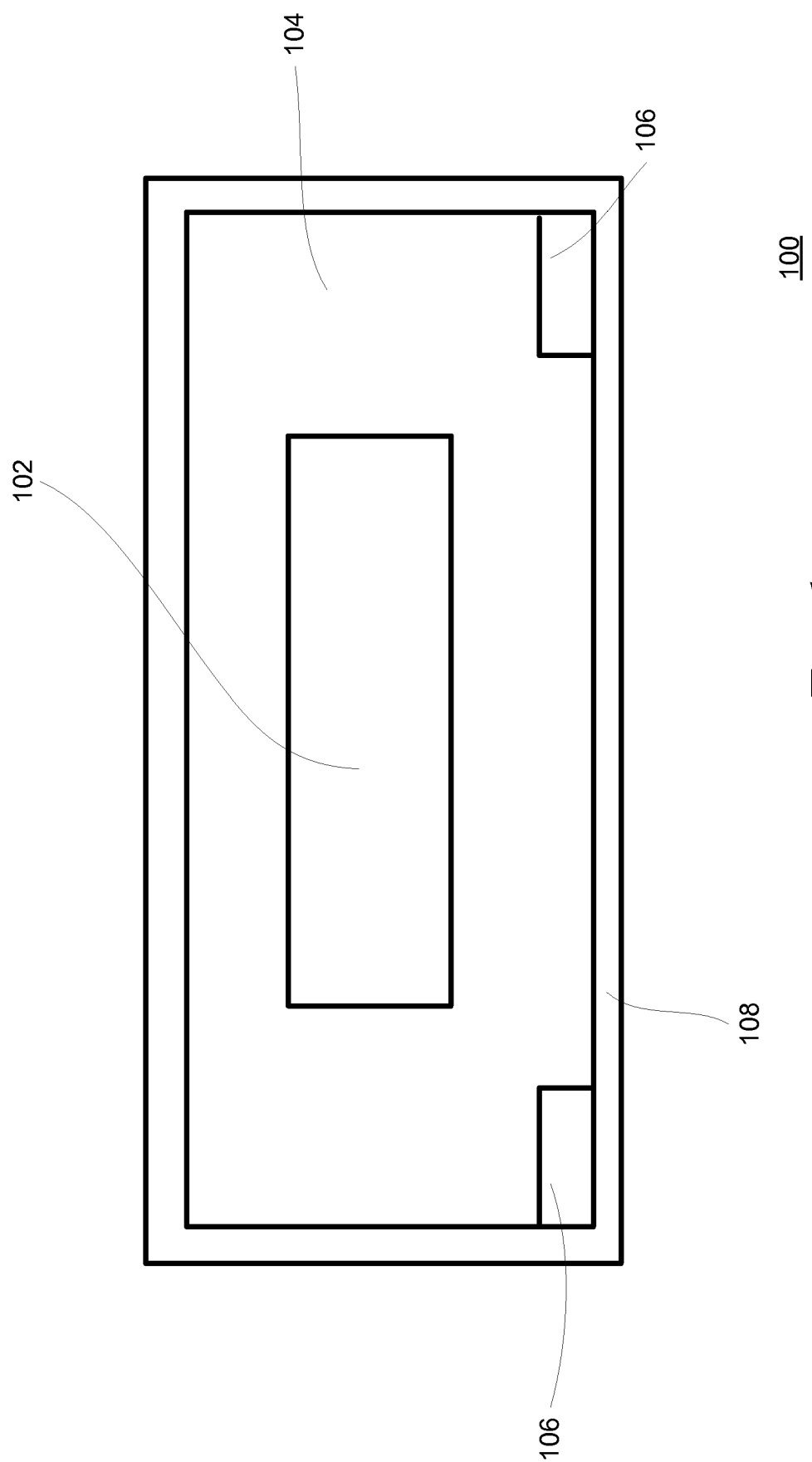
FIG. 1 shows a cross-sectional schematic view of an exemplary packaged chip device including a low-temperature ALD film, in accordance with an exemplary embodiment of the present invention.

As used in this description and the accompanying claims, a low-temperature atomic layer deposition (ALD) film is an ALD film that is deposited at a temperature below around 200° C. and typically below around 175° C.

Various embodiments in this invention cite chip packages as "plastic packages" for clarity because this is a common form. Plastics are polymeric materials. Polymeric materials may, or may not, incorporate fillers, and can be manufactured in many forms including coatings, moldings parts, elastomers and gels. As used in this invention, the term "plastic" descriptions should be interpreted in this broad polymer context.

Certain embodiments relate to chip devices such as, for example, electronic devices (e.g., integrated circuit devices), MEMS devices (e.g., inertial sensors such as accelerometers and gyroscopes, microphones, pressure sensors, flow sensors, microswitches, composition sensors that characterize permittivity or other conditions, optical devices, etc.), and integrated MEMS devices including both electronic circuitry and moving structures, to name but a few. Such chip devices may be capped (e.g., using a plastic/polymer cap, a metal cap, a ceramic cap, a glass cap, or a so-called "film cap" as described in the provisional patent application incorporated by reference above) or uncapped. Capped chip devices may or may not be hermetic.

Such chip devices are often provided in a packaged form, for example, in a plastic/polymer package, in a metal package, in a ceramic package, in an epoxy package, or mounted to a substrate such as a circuit board. Such packaged chip devices typically include exposed electrical contacts (leads) allowing for electrical connections to the chip device. Packaged chip devices may or may not be hermetic. Packaged chip devices can be exposed to a variety of environmental conditions (e.g., air, moisture, chemicals, particulate matter, temperature extremes, mechanical stresses, etc.). Different types of packaged chip devices can perform differently under different environmental conditions.

For example, plastic packaged chip devices generally are susceptible to moisture absorption and can exhibit package failures or unacceptable performance shifts when moisture absorption is excessive. For example, absorbed moisture can cause delamination (separation of the plastic or the die-attach from the die or the die paddle) when plastic packaged parts are soldered onto a substrate such as a circuit board. Therefore, plastic packaged chip devices are often "dry packed," which typically involves drying the devices in an oven, putting the devices onto a tape/reel, and sealing the tape/reel in an evacuated package. Dry packing adds cost both for the device supplier and for the customer; once the dry pack is opened, the devices generally must be assembled within a specified time or re-dried (see, for example, IPC/JEDEC J-STD-020, which is a standard for determining Moisture Sensitivity Level of a product; and IPC/JEDEC J-STD-033B, which specifies re-bake requirements; both of which are hereby incorporated herein by reference in their entireties. For example, products rated MSL-3 must be re-baked unless assembled within a week after the package is opened). Coatings of organic materials such as parylene, board coating, or potting material are intrinsically permeable to moisture and do not significantly retard the moisture absorption rate of the package. Furthermore, any such organic coating would have to be selectively removed from the metal contacts in order to allow the device to be soldered or otherwise electrically connected to the system.

Other types of packaged chip devices may have similar and/or other environmental issues.

In exemplary embodiments of the present invention, a low-temperature inorganic dielectric ALD film (e.g., $Al_2O_3$ and $TiO_2$) is deposited on a packaged chip device so as to coat the packaged chip device including any exposed electrical contacts. Such a low-temperature ALD film generally can be deposited without damaging the packaged chip device. The ALD film is typically deposited at a sufficient thickness to provide desired qualities (e.g., hermeticity for the entire packaged chip device, passivation for the electrical contacts, thermal conductivity/dispersion, etc.) but still allow for electrical connections to be made to the electrical contacts (e.g., by soldering or otherwise) directly through the ALD film without having to expose the electrical contacts.

Figure 2:
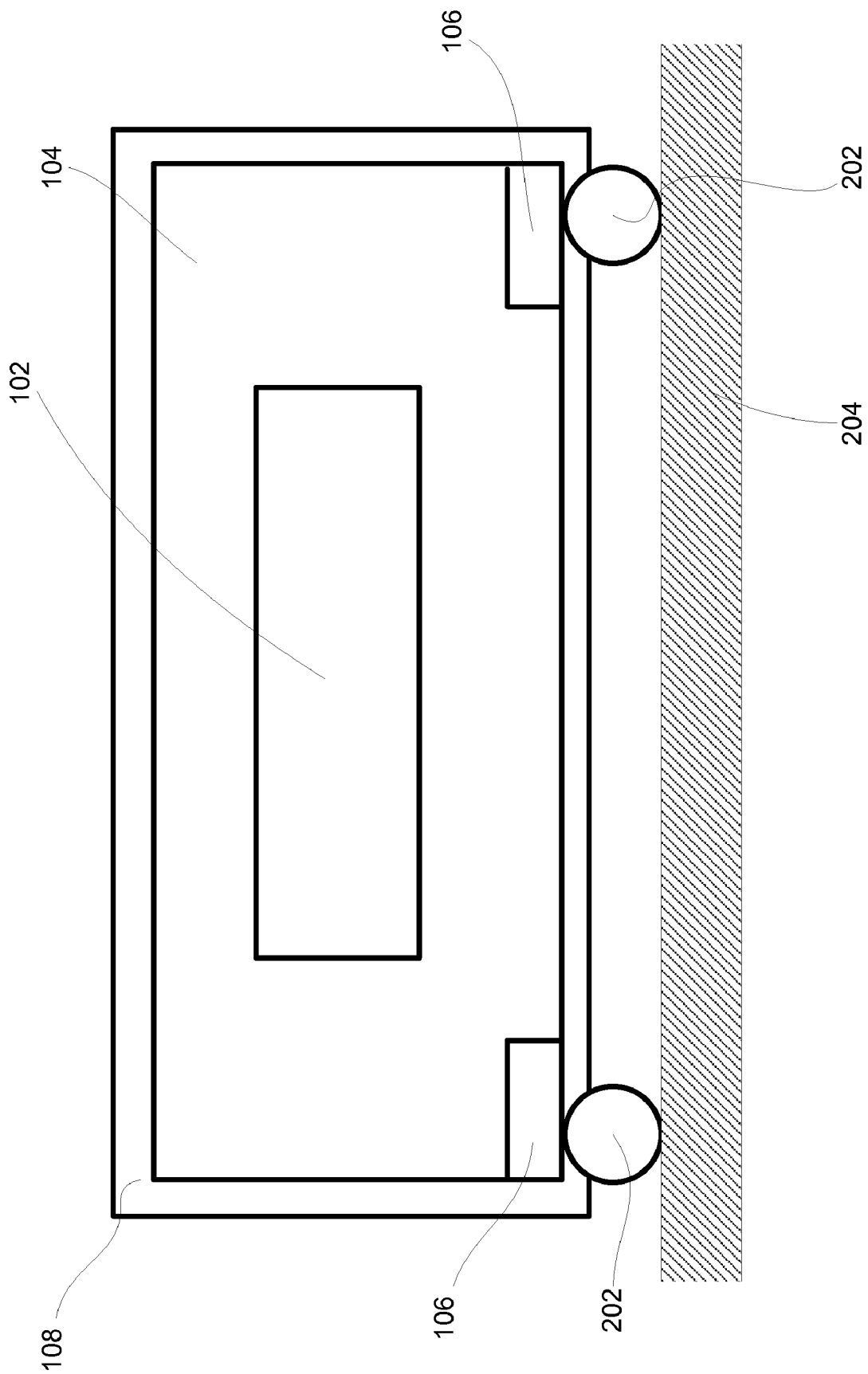
FIG. 2 shows a cross-sectional schematic view of the packaged chip device of FIG. 1 soldered to a circuit board directly through the ALD film without first exposing the electrical contacts, in accordance with an exemplary embodiment of the present invention.

FIG. 1 shows a cross-sectional schematic view of an exemplary packaged chip device 100 including a low-temperature ALD film, in accordance with an exemplary embodiment of the present invention. Among other things, the packaged chip device 100 includes a chip device 102 encased in a package 104 having electrical contacts 106 allowing for electrical connections to the chip device 102. An inorganic dielectric ALD film 108 is deposited so as to cover the package 104 including the electrical contacts 106, for example, after product branding. The ALD coating is typically deposited at a sufficiently low temperature so as to not damage the package 104, the contacts 106, or the chip device 102 (e.g., <200° C. and typically <175° C.). The ALD coating can be deposited to any desired thickness, although in specific embodiments, the ALD coating is deposited to a thickness that still allows electrical connections to be made to the electrical contacts 106 directly through the ALD film 108 (e.g., by soldering) without having to expose the electrical contacts 106 (e.g., approximately 100-200 angstroms thick, although the film may be thinner or thicker as appropriate for various applications). FIG. 2 shows a cross-sectional schematic view of the packaged chip device 100 soldered to a circuit board 204 via solder 202 through the ALD film 108 without first exposing the electrical contacts 106, in accordance with an exemplary embodiment of the present invention.

Because vapor-deposited ALD films are conformal on an atomic scale, crevices at the interface between the electrical contacts 106 and the package 104 should be fully coated and sealed. Furthermore, such ALD films will generally passivate the contact leads (e.g., tin plating on the contact leads), so corrosion during storage should be reduced or eliminated. An appropriate ALD film of sufficient thickness could be used to make the packaged device hermetic (or near hermetic), and, since moisture absorption generally is a function of exposure area and permeation rate, even a scratch on the ALD film should not destroy its effectiveness in typical applications. An ALD film of approximately 100-200 angstroms thickness deposited at a low temperature (e.g., <200° C. and typically <175° C.) should be sufficient to achieve desired barrier qualities. The low temperature makes deposition of ALD films in the presence of organics practicable, in particular, to plastic-packaged products. It is envisioned that plastic packaged chip devices coated with such ALD films could be rated as MSL-1 (i.e., no dry pack and unlimited floor life), which would be advantageous from both a cost perspective and a competitive perspective. At the described thickness ranges, the ALD film covering the electrical contacts should break up and disperse in solder as a nano-level trace impurity during assembly, thus allowing the device to be electrically connected to the system without having to expose the electrical contacts prior to soldering.

Some chip devices, such as MEMS microphones, pressure sensors, valves, and flow sensors, must physically communicate with the environment outside of the device package. Such chip devices typically are mounted in packages that have an opening to the environment. Such exposure to the environment makes the chip devices susceptible to reliability problems arising from such things as moisture, corrosion, surface leakage, and other forms of chemical attack.

With regard specifically to pressure sensors, in order to help reduce some of the above-mentioned effects, pressure sensors are sometimes covered with a layer of gel or parylene. Such protective layers are typically useful but have limitations (see, for example, S. Petrovic, A. Ramirez, T. Maudie, D. Stanerson, J. Wertz, G. Bitco, J. Matkin, D. J. Monk, "Reliability test methods for media-compatible pressure sensors", IEEE Trans. Industrial Electron., 45 (6), 877-885 (1998) and S. Petrovic, "Progress in media compatible pressure sensors", Proc. of InterPACK'01, the Pacific Rim/International Intersociety Electronic Packaging Technical/Business Conf. & Exhibition (ASME, New York 2001) IPACK2001-15517, both of which are hereby incorporated herein by reference in their entireties).

Similar treatments can be selectively applied to interconnect and circuit areas of a MEMS microphone, but, from a practical standpoint, gels and parylene generally cannot be applied over microphone sensing diaphragms because the added mass would negatively impact its function. Also, wire bond pads are generally difficult to coat with gel if the adjacent diaphragm must be kept free of gel.

Therefore, in exemplary embodiments, a protective ALD film is deposited on the exposed structures, including wire bond pads, interconnect areas, circuit areas, and even any moving parts exposed to the environment (e.g., the MEMS microphone diaphragm). An ALD film of approximately 100 angstroms thickness should be insignificant in terms of the diaphragm mass and its dynamic response while protecting those structures. Even in this thickness regime, ALD films typically have barrier and dielectric characteristics that make them effective as passivation films to protect devices from environmental effects. Deposition of an ALD film onto packaged parts like microphones and pressure sensors after they are assembled also would protect bond pad regions, the wire itself, and other susceptible structures/materials and therefore would tend to provide enhanced reliability.

Figure 3:
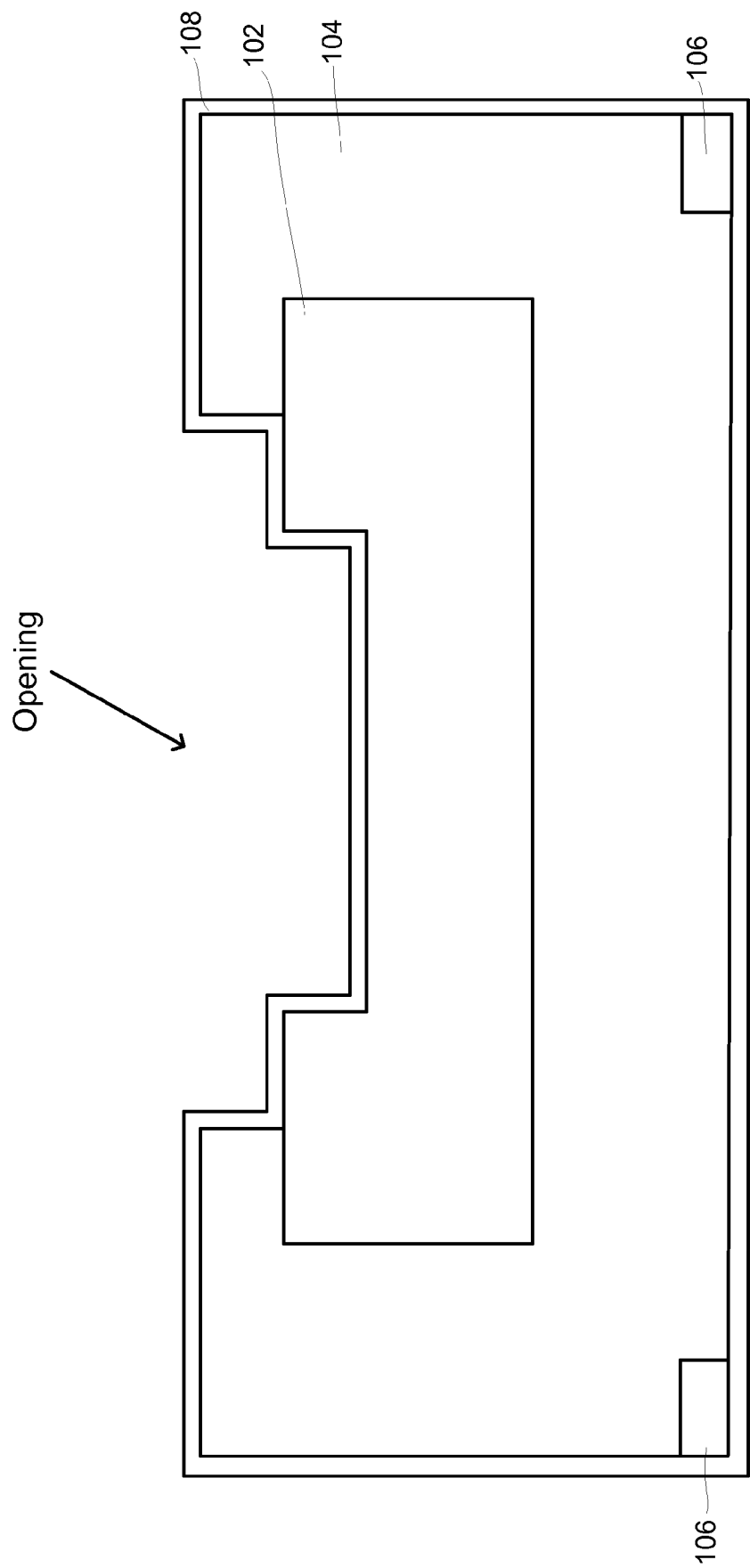
FIG. 3 shows a cross-sectional schematic view of an exemplary open-packaged chip device including an ALD film covering exposed structures such as wire bond pads, interconnect areas, circuit areas, and moving parts exposed to the environment (e.g., a MEMS microphone diaphragm), in accordance with an exemplary embodiment of the present invention.

FIG. 3 shows a cross-sectional schematic view of an exemplary open-packaged chip device 100 including an ALD film 108 covering exposed structures such as wire bond pads, interconnect areas, circuit areas, and moving parts exposed to the environment (e.g., a MEMS microphone diaphragm), in accordance with an exemplary embodiment of the present invention. The chip device 102 may be a MEMS microphone, pressure sensor, flow sensor, microswitch, or other type of chip device.

In both open and closed packaged chip devices coated with an ALD film, the top surface of the ALD film may be passivated (e.g., using an organic substance such as perfluorodecyltrichlorosilane (FDTS)) in order to make the film hydrophobic. A hydrophobic film might be particularly useful for an open-packaged MEMS microphone, particularly those used in cell phones and other applications where exposure to moisture is expected.

In certain alternative embodiments, a chip device may be coated within an ALD film that covers one or more electrical contacts, and the coated chip device may be electrically connected (e.g., soldered) to a substrate such as a circuit board directly through the ALD film.

In yet other alternative embodiments, a packaged or unpackaged chip device may be electrically connected (e.g., soldered) to a substrate such as a circuit board, and an ALD film may be disposed over some or all of the exposed surfaces of the chip device and substrate.

The exemplary embodiments described above are typically described with reference to the use of low-temperature ALD films as environmental barriers that protect the chip device or the plurality of chip devices. However, in some embodiments, the environment must be protected from the chip. For example, a flow sensor or the flow channel in a flow meter or a composition sensor may need to be biocompatible. Biocompatibility is not normally a characteristic that is considered in selecting the materials used to manufacture chips and chip packaging. In these devices, a biocompatible low-temperature ALD film material would be deposited to shield the sensitive medium from the device. The top surface of this ALD film may optionally be passivated with a suitably chosen substance to make the surface hydrophilic, hydrophobic, biologically inactive or biologically active, as required by the application.

As discussed in the provisional patent application incorporated by reference above, ALD films may also be used at the wafer and chip levels.

For example, an ALD film may be deposited to seal a passivation layer after removal of a sacrificial layer in order to protect the passivation layer from further damage. Such an ALD film would typically coat not only the passivation layer but also other exposed components including such things as micromachined moving parts and electrical contacts, and therefore the ALD film should be very thin so as to provide a negligible impact on performance of the moving parts and also to allow for electrical connections to be made directly through the ALD film without having to first expose the electrical contacts. Also, because the ALD film is deposited after release of the moving parts, the ALD film would preferably be deposited using a technique other than plasma deposition (e.g., vapor deposition), since plasma deposition generates electrical charges that could damage the sensitive moving parts or lead to stiction. In this regard, the ALD layer should be sufficiently thin to avoid excessive build-up of electrical charge that could also lead to stiction.

Also, a device wafer may be coated with an ALD film in order to electrically insulate microstructures, for example, when they are immersed in liquid baths or otherwise exposed to a medium that has significant electrical conductivity, whether during wafer fabrication or in a finished device. Among other things, an ALD film could be used to electrically isolate sensitive MEMS resonators and other components. The ALD film may be a dielectric film so as to provide electrical insulation for the devices. The wafer devices may be MEMS sensors such as accelerometers or gyroscopes or composition sensors that characterize permittivity among other things.

Also, an ALD film may be formed as a passivation barrier on the wafer so as to eliminate the need for masking to open areas such as probe and bond pads and metal interconnects. Specifically, the ALD layer would be formed to an appropriate thickness (e.g., approximately 100 angstroms) that allows for wafer probing and wire bonding directly through the ALD film. Such ALD passivation layers may be particularly useful for microswitch product wafers, or any product wafer that is difficult to passivate using standard processes, or, which would be produced at a lower cost if standard passivation layers were eliminated. Specifically, one or more ALD passivation layers would be deposited on a capped MEMS wafer such as a capped microswitch wafer after capping in order to seal the surface, including the interconnect traces, thus suppressing undesirable effects such as electrical leakage and corrosion.

Also, an ALD film may be formed as a protective layer over exposed materials (e.g., aluminum or aluminum alloys) during etch processes, specifically HF etch processes. This ALD film might be approximately 200 angstroms thick, which should be thin enough to not require removal after the etch process is completed.

Also, ALD films could be used for hard masks, for example, to enhance marginal masking or passivation, thus reducing or eliminating the incidence of pitting or excessive attack on these nearby materials. Here, an ALD film is deposited, e.g., on the passivation or before the photoresist, to enable reliable production and/or reliable performance. In such embodiments, the ALD film may have a thickness of around 50 angstroms.

Also, ALD films could be used to provide electrical interconnections and insulators at the wafer, chip, and/or package layer. For example, a conductive ALD film may be deposited in order to form an electrical connection during wafer level fabrication with no significant effect on planarity. Similarly, a dielectric ALD film may be deposited in order to provide an insulating layer. Masking may be used to control ALD deposition.

Also, an ALD film may be deposited over a film cap in order to provide hermeticity or other property. The ALD film would typically be deposited prior to singulation, although it could be deposited after singulation in some instances. An ALD film of approximately 100 angstroms thickness may be used, which should be thin enough to allow for probe and wire bonding directly through the ALD film. In such an embodiment in which the ALD coating makes such a polymer film cap hermetic, the device may be packaged at low temperature, so a mechanically compliant die attach could be used (e.g., gyros are extremely stress-sensitive). This polymer film cap also imposes low mechanical stress on the die, thus allowing the production of stress-sensitive devices at higher yield or higher performance than alternative technologies which utilize silicon caps.

Also, an ALD film may be deposited using a high-rate deposition process that produces a nano-rough surface. The nano-rough surface could be used, for example, to suppress stiction in products such as microphones and low-g accelerometers or to increase the magnitude of interaction with the surrounding media (e.g., in a composition sensor).

In the above-described embodiments, the ALD film may be coated with a passivation layer. Among other things, such a passivation layer may be used to provide hydrophobic properties, hydrophilic properties, biocompatibility, heat dissipation or insulation, or other properties. The passivation layer may include, for example, a self-assembled monolayer (SAM) coating such as octyltrichlorosilane (OTCS) or perfluorodecyltrichlorosilane (FDTS). FDTS has non-stick properties that may be undesirable in certain situations, such as, for example, situations in which the FDTS coating could prevent or reduce adhesion of plastic or solder. OTCS might be a better choice for use in such situations. Other types of passivation layers may be used, for example, epoxy-based coatings. As mentioned above, a hydrophobic film might be particularly useful for coating MEMS microphone structures that otherwise would be exposed to the environment, particularly those used in cell phones and other applications where exposure to moisture is expected.

It should be noted that some exemplary embodiments are described above with reference to ALD films of various thicknesses that are deposited at various temperatures. Embodiments of the present invention are not necessarily limited to the thicknesses and temperatures set forth above. Based on the teachings of this disclosure, a person of ordinary skill in the art would be able to determine appropriate film thickness, deposition temperature, film material and other parameters for specific applications without undue experimentation. For example, in order to produce a packaged chip device having an ALD film that provides a specified level of hermeticity, one could run tests with ALD films of different thicknesses until the specified level of hermeticity is reached. Similarly, in order to produce a packaged chip device having an ALD film that provides a specified level of passivation for electrical contacts but still allows soldering directly through the ALD film without having to expose the electrical contacts, one could run tests with ALD films of different thicknesses to determine an appropriate ALD film thickness. It is recognized that, in some cases, it may not be possible for an ALD film to meet every conceivable combination of performance goals for a desired application, but this fact does not in any way compromise the invention. Again, it would not take undue experimentation to perform tests with different ALD film thicknesses and/or different ALD deposition temperatures in order to determine whether desired performance goals can be met.

The present invention may be embodied in other specific forms without departing from the true scope of the invention. The described embodiments are to be considered in all respects only as illustrative and not restrictive.

What is claimed is:

1. Apparatus comprising:
 a packaged chip device including a chip device packaged in a package having at least one electrical contact allowing for electrical connection to the chip device; and
 a low-temperature inorganic dielectric atomic layer deposition film disposed on an outer surface of the packaged chip device and covering the at least one electrical contact, the atomic layer deposition film being of a thickness allowing electrical connection to the at least one electrical contact through the atomic layer deposition film without having to expose the at least one electrical contact.

2. Apparatus according to claim 1, wherein the chip device includes an integrated circuit device.

3. Apparatus according to claim 1, wherein the chip device includes a MEMS device.

4. Apparatus according to claim 3, wherein the MEMS device includes at least one of:
 a MEMS accelerometer; and
 a MEMS gyroscope.

5. Apparatus according to claim 1, wherein the packaged chip device is non-hermetic, and wherein the atomic layer deposition film hermetically envelops the packaged chip device.

6. Apparatus according to claim 5, wherein the package is plastic.

7. Apparatus according to claim 1, wherein the atomic layer deposition film passivates the at least one electrical contact.

8. Apparatus according to claim 1, further comprising:
 a passivation material disposed over the atomic layer deposition film.

9. Apparatus according to claim 8, wherein the passivation material is a self assembling monolayer material.

10. A device or method according to claim 9, wherein the self assembling monolayer material includes at least one of:
 octyltrichlorosilane (OTCS); and
 perfluorodecyltrichlorosilane (FDTS).

11. Apparatus according to claim 1, wherein the packaged chip device includes an opening, and wherein the atomic layer deposition film covers structure exposed through the opening so as to protect the structure from exposure to the external environment.

12. Apparatus according to claim 11, wherein the structure exposed through the opening include at least one of:
 a wire bond pad;
 an interconnect;
 a circuit; and
 a moving part.

13. Apparatus according to claim 11, wherein the chip device includes a MEMS microphone device, and wherein the atomic layer deposition film covers an exposed diaphragm of the MEMS microphone device.

14. Apparatus according to claim 11, wherein the chip device includes a MEMS pressure sensor, and wherein the atomic layer deposition film covers an exposed structure of the MEMS pressure sensor.

15. Apparatus according to claim 11, wherein the chip device includes a MEMS flow sensor, and wherein the atomic layer deposition film covers an exposed structure of the MEMS flow sensor.

16. Apparatus according to claim 11, wherein the chip device includes a MEMS microswitch, and wherein the atomic layer deposition film covers an exposed structure of the MEMS microswitch.

17. Apparatus according to claim 1, further comprising a substrate, wherein the packaged chip device is electrically connected to the substrate directly through the atomic layer deposition film.

18. Apparatus according to claim 1, wherein the atomic layer deposition film comprises alternating layers of $Al_2O_3$ and $TiO_2$.

* * * * *